(12) United States Patent
Sforzin et al.

(10) Patent No.: US 7,903,478 B1
(45) Date of Patent: Mar. 8, 2011

(54) HIGH IMPEDANCE REFERENCE VOLTAGE DISTRIBUTION

(76) Inventors: Marco Sforzin, Cantu (IT); Emanuele Confalonieri, Milan (IT)

( * ) Notice: Subject to any disclaimer, the term of this patent is extended or adjusted under 35 U.S.C. 154(b) by 149 days.

(21) Appl. No.: 12/355,466

(22) Filed: Jan. 16, 2009

(51) Int. Cl.
*G11C 7/00* (2006.01)

(52) U.S. Cl. .......... 365/189.09; 365/185.03; 365/185.08; 365/185.11; 365/185.21; 365/185.2; 365/185.22; 365/185.25; 365/230.03

(58) Field of Classification Search .................. 365/148, 365/185.03, 185.08, 185.11, 185.21, 185.22, 365/185.25, 189.09, 230.03, 185.2
See application file for complete search history.

(56) References Cited

U.S. PATENT DOCUMENTS

| | | | |
|---|---|---|---|
| 2007/0008781 A1* | 1/2007 | Jono et al. | 365/185.23 |
| 2007/0121377 A1* | 5/2007 | Kajiyama | 365/185.02 |

\* cited by examiner

*Primary Examiner* — Hoai V Ho
(74) *Attorney, Agent, or Firm* — Berkeley Law & Technology Group, LLP

(57) ABSTRACT

A sense amplifier may be used to measure voltages and/or currents that represent logic levels stored in memory cells of memory devices. Accuracy and stability of such measurements may be improved by selective switching to isolate sense amplifiers from other portions of a circuit.

20 Claims, 5 Drawing Sheets

HIGH IMPEDANCE REFERENCE VOLTAGE DISTRIBUTION

BACKGROUND

Field

Subject matter disclosed herein relates to memory devices.

Information

A memory device typically includes multiple memory cells to store information. A read, write, and/or verify function may be applied to each such memory cells. During a read and/or verify operation, a biasing reference voltage may be applied to a sense amplifier electrically connected to column decoding and/or bit lines that are electrically connected to a drain of a memory cell to which the read/verify operation is applied, for example. During such operations, the stability of a biasing reference voltage may be important regarding the accuracy of retrieving information from the memory cell. For example, an unstable biasing reference voltage may affect operation of a sense amplifier used to determine information stored in the memory cell.

A memory device may include multiple banks or groups of memory cells, allowing dual operations in a single clock cycle, for example. Such multiple banks may utilize a same biasing reference voltage source. Unfortunately, an operation on one bank may disturb the stability of the biasing reference voltage so as to affect the reliability of data read and/or verify operations on another bank. In addition, such a stability disturbance may be a greater problem with multilevel memory cells, which typically involve a sense amplifier involving a relatively high precision to distinguish among the cells' stored contents.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a memory device, such as a flash memory device and/or a phase-change memory device, may include one or more memory cells that may be arranged in multiple banks, or partitions, for example. For example, such flash memory devices may include NOR and/or NAND flash memories. In a particular implementation, such as for flash memory, such memory cells may include single level memory cells to store a single bit per cell. Such memory cells may also include multilevel memory cells to store multiple bits per cell. A single bit may include one of either a high logic level or a low logic level corresponding to two different voltages of a memory cell transistor's floating gate, for example. In contrast, a multilevel flash memory cell may include a transistor having a floating gate that can accommodate multiple voltage levels that correspond to multiple bits. In a particular embodiment, a sense amplifier may be used to measure voltages and/or currents that represent logic levels stored in memory cells. For example, a measured voltage of a memory cell may represent a voltage of the memory cell's floating gate, whereas a measured current of a memory cell may represent an electrical charge stored on the memory cell's floating gate. Accuracy and stability of such measurements may be important so that the sense amplifier may distinguish between and/or among different values of voltages and/or currents that are relatively small and relatively close together. For example, if a sense amplifier measures a voltage and/or current of a memory cell's floating gate higher than its true value, then an incorrect value of the memory cell's stored contents may be read.

Figure 1:
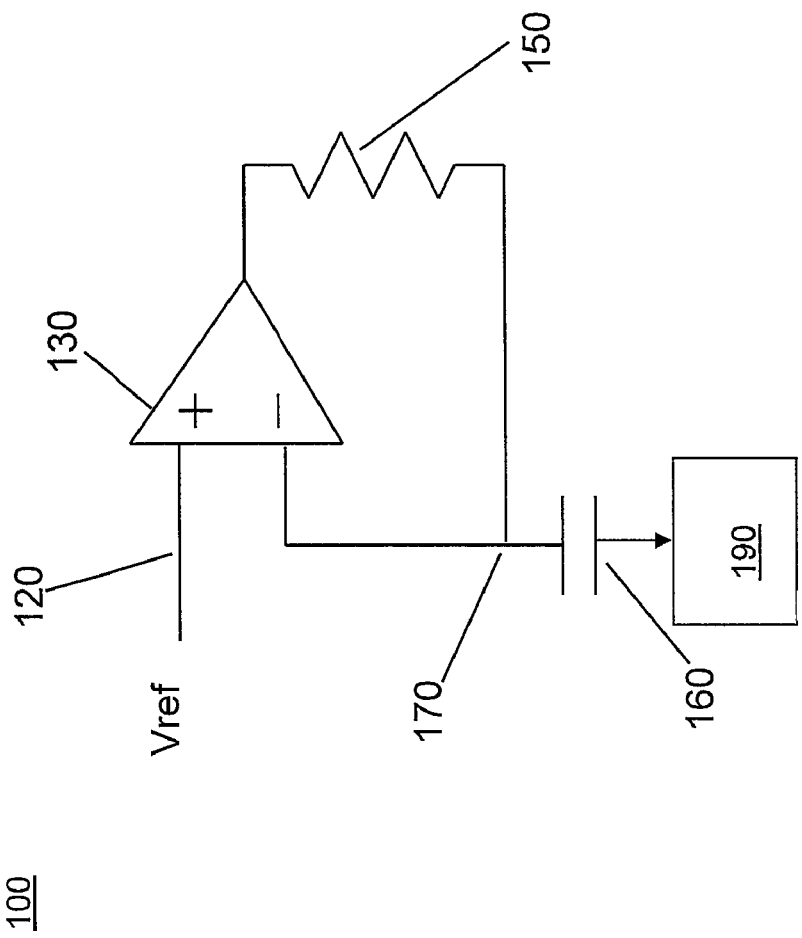
FIG. 1 is a schematic view of a portion of a sense amplifier circuit, according to an embodiment.

FIG. 1 is a schematic view of a portion of a sense amplifier circuit 100 with an applied reference voltage Vref, according to an embodiment. For example circuit 100 may comprise a bit-line biasing circuit, wherein the bit-line may be electrically connected to the drain of a memory cell to which a read/verify operation is applied. Accordingly, circuit 100 may also comprise a drain biasing architecture. Such a circuit may comprise a differential amplifier, for example. Vref, which may comprise a reference voltage for a memory device, may be applied to a non-inverting input 120 of a differential operational amplifier 130. Node 170 may be electrically connected to an inverting input of differential operational amplifier 130 while also connected to a memory cell 190 via a capacitance 160. Such a capacitance may include a stray and/or parasitic capacitance of an input to memory cell 190 including, for example, parasitic capacitances of column pass transistors, bit line capacitance, and/or cell capacitance. Capacitance 160 may also include a capacitor. The voltage drop across resistor 150, which may be used to read a stored logic state of memory cell 190 for example, may be calculated to be $V_r = sRC \cdot V_{ref}$, where R is the resistance of resistor 150, C is the capacitance of capacitor 160, and s may comprise a variable in the Laplace Domain. For example, sRC may comprise a transfer function between Vref and Vr. Accordingly, the voltage at node 170 may be substantially proportional to Vref at a fixed frequency, as shown by the equation above. Thus, voltage drift, noise, and/or any other such voltage instability of Vref may find its way to node 170, which may be problematic since a relatively unstable voltage level may not accurately measure a voltage and/or current of memory cell 190. Such voltage instability of Vref may be generated by circuit activity in portions of circuitry that are electrically connected to Vref, such as switches, passive and active circuit elements, and buffers (not shown), just to name a few examples. Capacitive coupling from neighboring circuitry may also induce voltage instability. In addition, a multibank flash memory device, or a memory device having multiple partitions or banks of memory cells, for example, may generate Vref instability by applying read and/or verify operations to the various partitions and/or banks of memory cells. For example, a read operation applied to one partition of a memory device may disturb the stability of Vref used by another partition during a verify operation. Of course, such a sense amplifier is merely an example, and claimed subject matter is not so limited.

In an embodiment, a global reference voltage Vref may be applied to multiple partitions of memory cells of a memory device via switches on individual partitions. During a standby state, a partition may be electrically connected to the global reference voltage via a closed switch. A memory cell, and/or a partition of multiple memory cells, may be in such a standby state if no read, write, and/or verify operations are applied to the memory cell(s). During this period, a capacitance, such as a capacitor and/or parasitic capacitance may be charged via the closed switch. During a read and/or verify operation applied to a partition, the switch may be opened for a predetermined time period to electrically isolate such a partition from the global reference voltage Vref and other partitions. As used herein, a partition that is electrically isolated from a portion of a circuit, for example, may mean that such a partition does not include an electrical connection to the portion of the circuit. Such an electrical connection may include conductive, capacitive, and/or inductive, for example. In a particular implementation, each branch, by default, may be connected to a global driver in a standby condition, and all the capacitances may therefore be charged. If a partition change state is to be implemented, such as for a read and/or verify process, then a branch related to the partition may be disconnected for a predetermined time from the global driver. If the read/verify evaluation process is terminated, then the branch may be reconnected to the global driver. While the partition is electrically connected to the global reference voltage Vref, the capacitance of the partition may be charged to have substantially the same reference voltage Vref. Consequently, the isolated partition may utilize the charged capacitance to supply reference voltage Vref during at least a portion of the time period that the read and/or verify operation is applied to the partition. Such a reference voltage Vref obtained from the capacitance of an isolated partition may not be affected by disturbing circuit activities taking place in other partitions of the memory device, for example. In a particular embodiment, partition switches may be opened for partitions that are to be read and/or verified, whereas switches may be closed for partitions in a standby state. Of course, such a process of reading and/or verifying partitions is merely an example, and claimed subject matter is not so limited.

Figure 2:
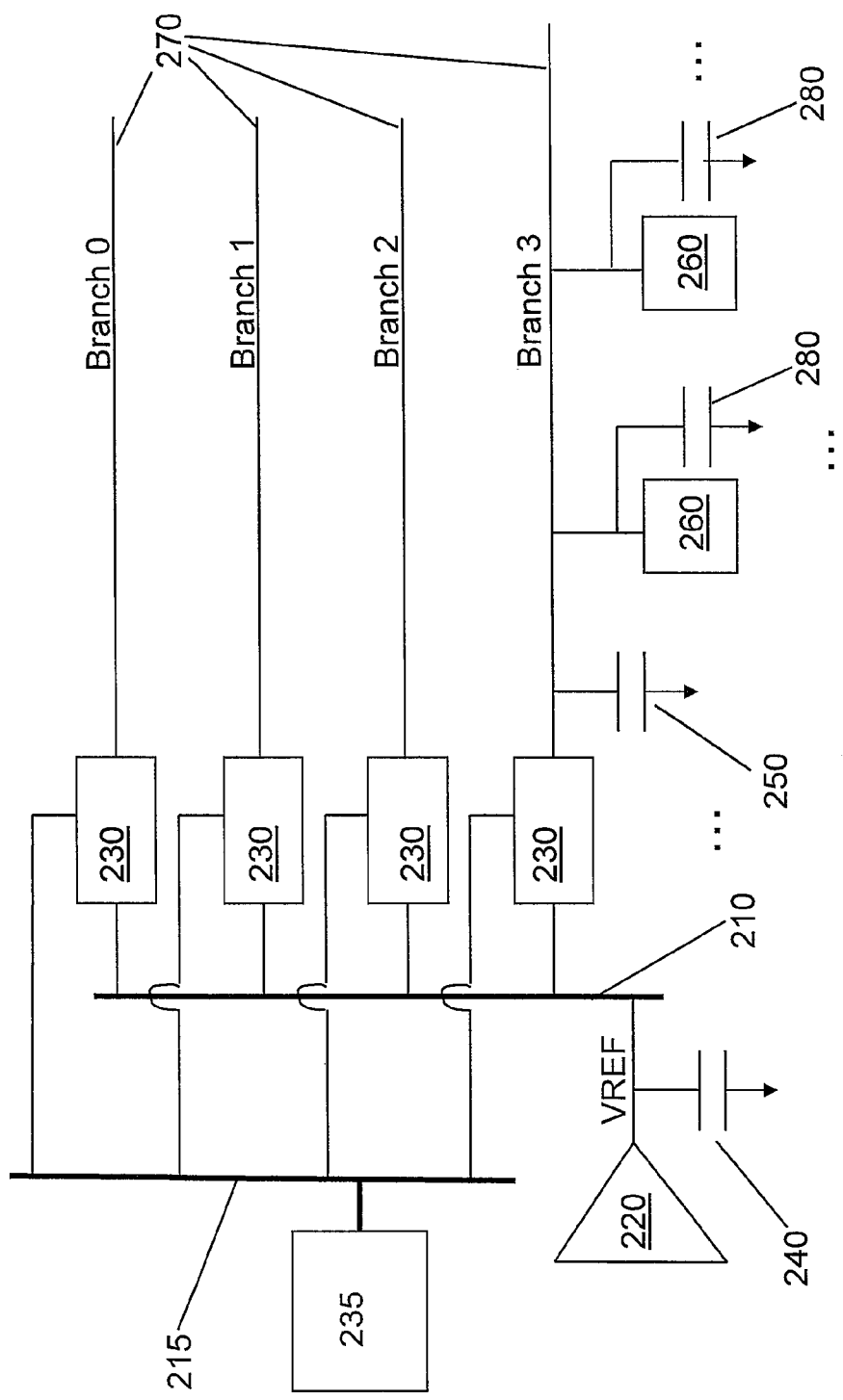
FIG. 2 is a schematic view of a portion of a circuit to distribute a reference voltage to multiple sense amplifier banks, according to an embodiment.

FIG. 2 is a schematic view of a portion of a circuit 200 to distribute a reference voltage to multiple sense amplifier banks, according to an embodiment. Such sense amplifier banks may comprise partitions that define minimum memory units that can be used for a dual work operation, for example. Such a circuit may comprise a portion of a memory device, which includes a multibank flash memory, for example. Such multiple banks are herein also called partitions. Four such partitions 270 are shown in the example embodiment of FIG. 2, though claimed subject matter is not limited to any particular number of partitions. Individual partitions may include a switch 230 that may be opened and/or closed by a controller 235 via control bus 215. In a particular embodiment, controller 235 may open and/or close switches 230 individually using an addressing scheme, wherein individual switches may be assigned a unique address, for example. Switches 230 may selectively electrically connect their respective partitions 270 to a global reference voltage (GVref) source 220 via Vref bus 210. GVref 220 may comprise an amplifier, a power bus, and/or a buffer, just to name a few examples. Accordingly, controller 235 may select particular partitions 270 to be electrically connected to GVref source 220 by opening and/or closing particular switches 230. A capacitance 240, which may comprise a capacitor and/or a stray capacitance, may be electrically connected to an output of GVref source 220. Capacitance 240 may provide stability to the voltage of the GVref 220 node, for example.

In an embodiment, an individual partition among partitions 270 may comprise multiple sense amplifiers 260, including a capacitance 280, which may comprise a capacitor and/or a parasitic capacitance, electrically connected to an input of sense amplifiers 260, for example. A memory cell, such as memory cell 190 shown in FIG. 1, may be electrically connected to the input of sense amplifier 260 via capacitance 280. In a particular embodiment, partition 270 may comprise any number of memory cells, and claimed subject matter is not limited to any particular number of memory cells. In addition, different partitions 270 may comprise different numbers of sense amplifiers and/or memory cells. In one implementation, for example, partition 270 may include a number of memory cells in the order of thousands or millions, but claimed subject matter is not so limited.

In an embodiment, individual partitions 270 may include a capacitance 250, which may comprise a capacitor and/or a parasitic capacitance. Capacitance 250 may be electrically charged by GVref source 220 if switch 230 is closed. If switch 230 is open, then capacitance 250 may discharge into remaining portions of partition 270, for example. The rate at which a voltage of capacitance 250 decreases during discharge may depend on the size of capacitance 250 and/or electrical characteristics of partition 270, such as gate current leakage of memory cells, which may be relatively small. Even considering such a discharge, the voltage of capacitance 250 may be substantially constant over a time period if such a time period is relatively short. As explained below, capacitor 230 may be used as a reference voltage source for an associated partition 270

Figure 3:
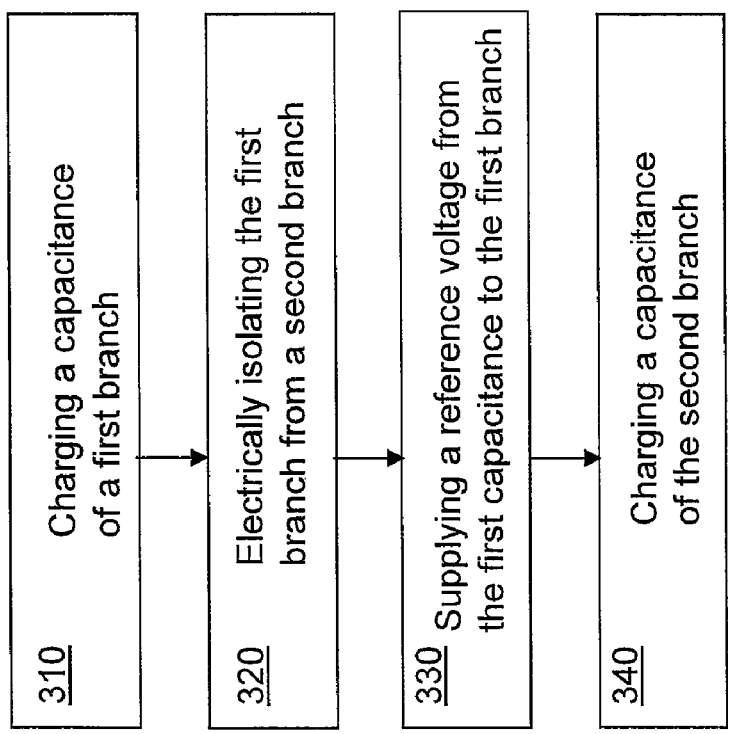
FIG. 3 is a flow diagram of a read and/or verify process of a memory device, according to an embodiment.

FIG. 3 is a flow diagram of a read and/or verify process 300 of a memory device, according to an embodiment. Such a memory device may comprise a portion of circuit 200 shown in FIG. 2, for example. At block 310, capacitances 250 of one or more partitions 270 may be electrically charged by GVref source 220 via closed switches 230. As discussed above, individual partitions may include one or more sense amplifiers associated with one or more memory cells, for example. Such partitions may include one or more portions of a memory device operating in a standby state, wherein neither read, write, nor verify operations are applied to the portion of the memory device. In a particular implementation, at block 320, one partition among partitions 270 may be electrically isolated from remaining partitions 270 by opening switch 230 associated with the one partition. In another particular implementation, more than one partition may be isolated from remaining partitions by opening switches associated with partitions to be isolated. Continuing with the former implementation, for example, partition 0 may be isolated from partitions 1, 2, and 3 if switch 230 associated with partition 0 is open while switches associated with partitions 1, 2, and 3 are closed. In this state, partition 0 may also be isolated from GVref source 220, whereas partitions 1, 2, and 3 may remain electrically connected to GVref source 220. Accordingly, capacitances 250 associated with partitions 1, 2, and 3 may continue to charge by GVref source 220 while capacitance 250 associated with partition 0 may cease to charge when switch 230 is opened. At block 330, capacitance 250 may supply a reference voltage to circuit elements of partition 0. For example, partition 0 may comprise sense amplifiers to which capacitance 250 may supply a reference voltage. Such sense amplifiers, as mentioned above, may be associated with memory cells to which read and/or verify operations may be applied while the reference voltage is supplied by capacitance 250 and partition 0 is electrically isolated from other partitions 270. Accordingly, partition 0 may include its own reference voltage source, such as charged capacitance 250, isolated from circuit activity occurring in remaining partitions 270. As a result of such isolation, capacitance 250 may act as a stable reference voltage source for partition 0.

In an embodiment, after read and/or verify operations are completed for an isolated partition, a controller, such as controller 235, may close the isolated partition's switch 230 to once again electrically connect the partition to GVref source 220. At substantially the same time, or after a delay, one or more other switches may be opened to isolate such switches' respective partitions. In this manner, partitions may in turn be isolated from other partitions. To continue with the example above, after isolating partition 0, partition 1 may be isolated next, then partition 2, then partition 3, and so on. As explained above, partitions that are not isolated from other partitions may also be electrically connected to GVref source 220. Accordingly, such non-isolated partitions may include a capacitance 250 that is charged by GVref source 220, as at block 340. Of course, a sequence of partition isolation is not limited to the example above, and claimed subject matter is not so limited.

Figures 4, 5:
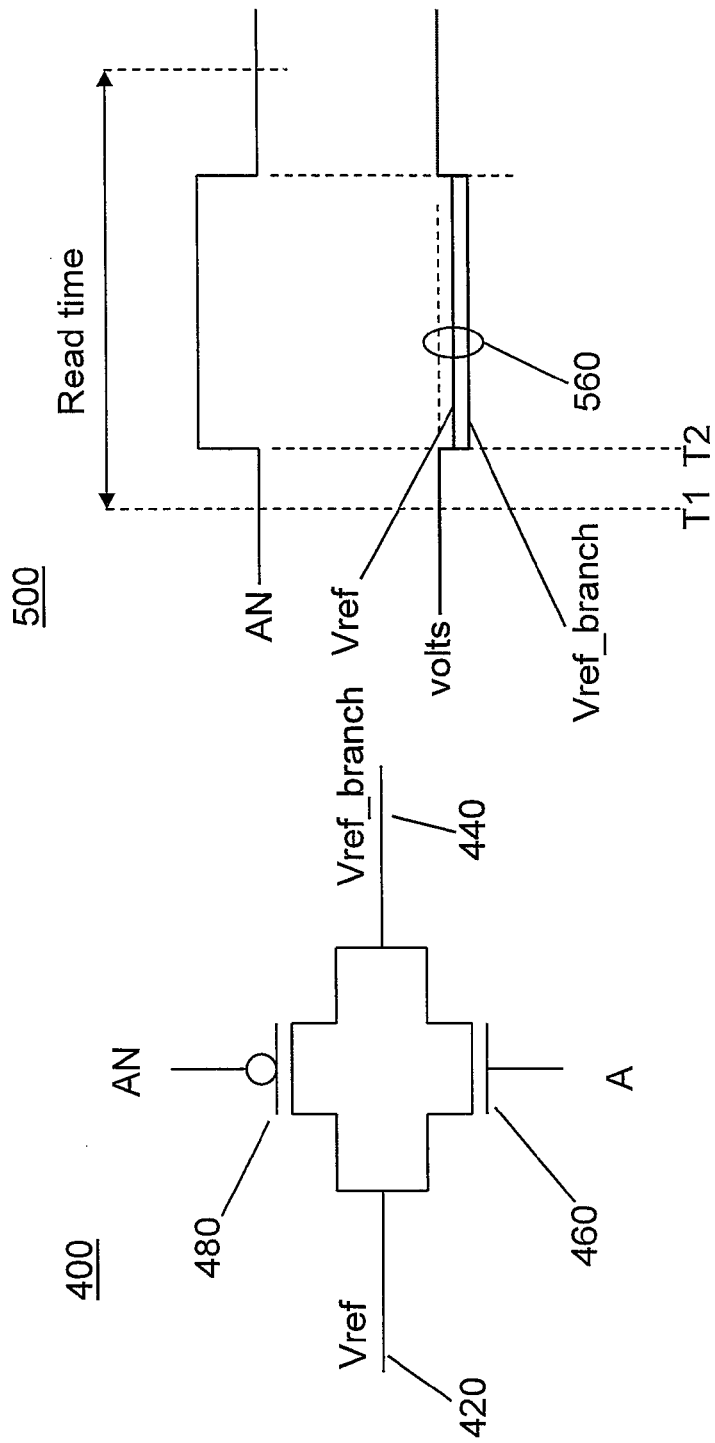
FIG. 4 is a schematic view of a switch, according to an embodiment.
FIG. 5 is a timing and voltage level diagram for a read and/or verify operation of a memory device, according to an embodiment.

FIG. 4 is a schematic view of a switch 400, according to an embodiment. Such a switch may be used as switch 230 shown in FIG. 2, for example. Vref line 420 may be connected to a global reference voltage source, such as GVref source 220. In one particular implementation, switch 400 may comprise an N-type metal oxide semiconductor (NMOS) 460 and a P-type metal oxide semiconductor (PMOS) 480. A logic signal A may be applied to NMOS semiconductor 460, whereas a logic signal AN may be applied to PMOS semiconductor 480. Signals A and AN may be logical compliments of one another so that if one signal is logic high, the other signal is logic low, and so on. Such signals may be generated by a controller, such as controller 235 shown in FIG. 2. Vref_partition line 440 may comprise a partition 270 as shown in FIG. 2, for example.

FIG. 5 is a timing and voltage level diagram for a read operation 500 of a memory device utilizing switch 400, according to an embodiment. In the example, signal AN begins at a logic low level so that signal A is at a logic high, leading to a closed switch 400. As discussed above, one or more memory cells associated with Vref_partition line 440 may be operating in a standby state. If switch 400 is closed, voltage levels on Vref line 420 and Vref_partition line 440 may be substantially equal since they are electrically connected to one another via the closed switch. At time T1, a read operation may be applied to one or more memory cells associated with partition 270, as explained above. In a particular embodiment, within a read time interval, logic level AN may be changed to high in order to open switch 400, as at time T2. Consequently, partition 270 may then be electrically isolated from Vref line 420, thus shifting associated memory cells from a standby state to a read state. Depending at least in part on parasitic capacitances of switch 400 and partition 270, the voltages of Vref line 420 and Vref_partition line 440 may drop and become unequal, as shown by difference 560. Such a voltage drop may arise from transistor MOS movement from an on to off state. If an NMOS transistor is on, for example, a channel (of electrons) may be formed under the transistor gate. If the NMOS transistor is switched off, the channel may be depleted so that electrons are shared by Vref and Vref branches. Accordingly, such an electron injection may lead to a voltage drop depending, at least in part, on a capacitance linked to each of the branches. After the read operation is complete, AN may be changed back to logic low in order to close switch 400 and electrically re-connecting partition 270 to Vref line 420, thus bringing associated memory cells back into a standby state. Such a read time interval may be of the order of 100 nsec, for example.

Figures 6, 7:
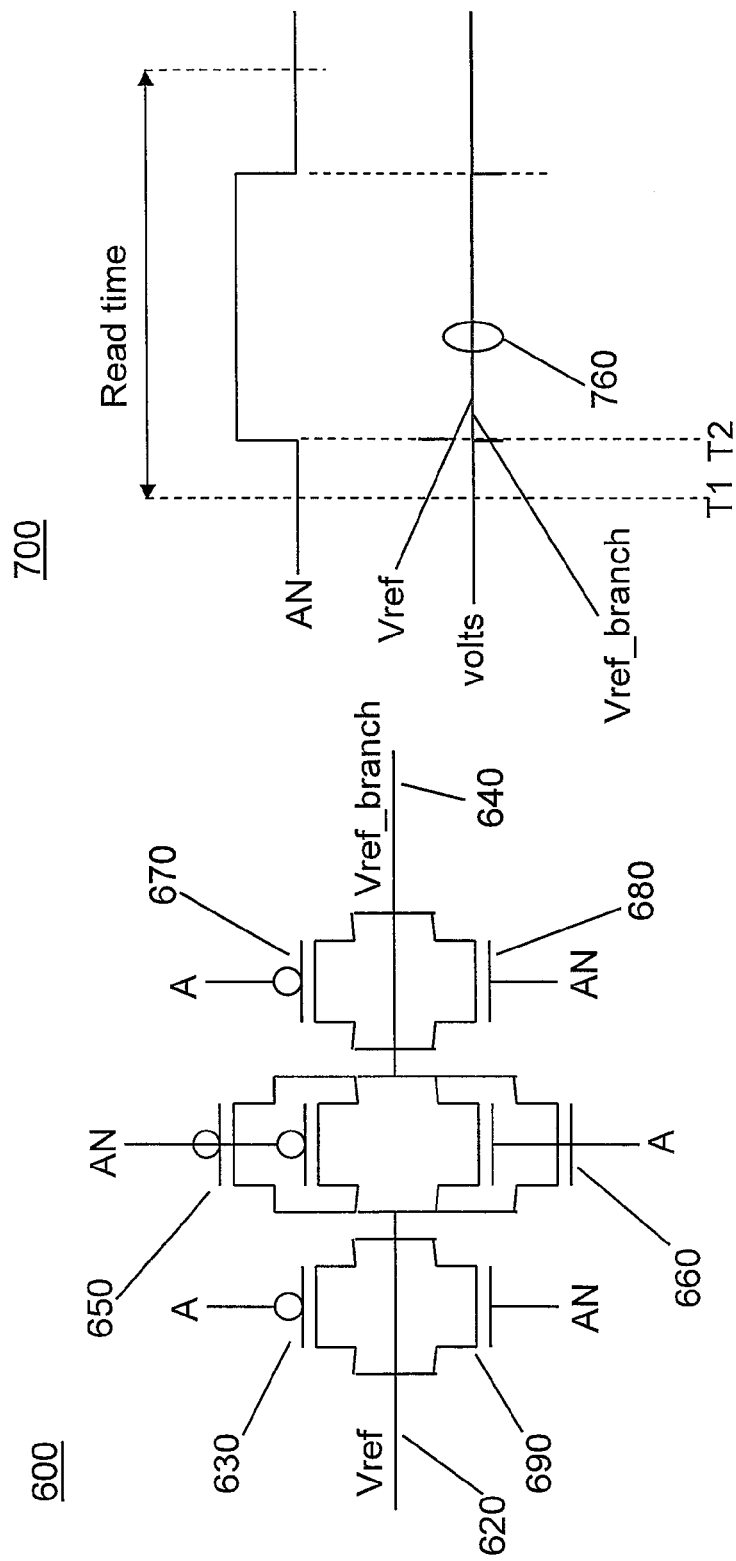
FIG. 6 is a schematic view of a switch, according to another embodiment.
FIG. 7 is a timing and voltage level diagram for a read operation of a memory device, according to another embodiment.

FIG. 6 is a schematic view of a switch 600, according to an embodiment. Such a switch may be used as switch 230 shown in FIG. 2, for example. Vref line 620 may be connected to a global reference voltage source, such as GVref source 220. In one particular implementation, switch 600 may comprise NMOS semiconductors 660, 680, and 690 and PMOS semiconductors 630, 650, and 670. A logic signal A may be applied to NMOS semiconductor 680 and PMOS semiconductors 630 and 670, whereas a logic signal AN may be applied to NMOS semiconductor 680 and 690 and PMOS semiconductor 650. As explained above, signals A and AN may be logical compliments of one another and may be generated by a controller, such as controller 235 shown in FIG. 2. Vref_partition line 640 may comprise partition 270 as shown in FIG. 2, for example.

FIG. 7 is a timing and voltage level diagram for a read operation 700 of a memory device utilizing switch 600, according to an embodiment. In the example, signal AN begins at a logic low level so that signal A is at a logic high, leading to a closed switch 600. As discussed above, one or more memory cells associated with Vref_partition line 640 may be operating in a standby state. If switch 600 is closed, voltage levels on Vref line 620 and Vref_partition line 640 may be substantially equal since they are electrically connected to one another via the closed switch. At time T1, a read operation may be applied to one or more memory cells associated with partition 270, as explained above. In a particular embodiment, within a read time interval, logic level AN may be changed to high in order to open switch 600, as at time T2. Consequently, partition 270 may then be electrically isolated from Vref line 620, thus shifting associated memory cells from a standby state to a read state. In contrast to switch 400 shown in FIG. 4, switch 600 may allow voltages of Vref line 620 and Vref_partition line 640 to be substantially equal, as shown by difference 760. After the read operation is complete, AN may be changed back to logic low in order to close switch 600 and electrically re-connecting partition 270 to Vref line 620, thus bringing associated memory cells back into a standby state.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method comprising:
   charging a first capacitance via a closed first switch of a first partition that includes a first group of sense amplifiers associated with a first plurality of memory cells;
   electrically isolating said first partition from a second partition that includes a second group of sense amplifiers associated with a second plurality of memory cells by opening said first switch; and
   supplying a reference voltage from said first capacitance to said first group of sense amplifiers to read and/or verify said first plurality of memory cells while said first partition is electrically isolated from said second partition.

2. The method of claim 1, further comprising:
   charging a second capacitance via a closed second switch of said second partition while said first partition is electrically isolated from said second partition.

3. The method of claim 1, further comprising:
   operating said second plurality of memory cells in a standby state while said first partition is electrically isolated from said second partition.

4. The method of claim 1, wherein said first capacitance comprises a capacitor.

5. The method of claim 1, wherein said first capacitance comprises a stray capacitance of said first partition.

6. The method of claim 1, wherein said memory cells comprise phase change memory cells.

7. The method of claim 1, wherein said memory cells comprise multilevel flash memory cells.

8. A memory device comprising:
   a reference voltage buffer;
   a plurality of partitions, each including a capacitance and one or more sense amplifiers associated with one or more memory cells;
   a plurality of switches, each switch being electrically connected between said reference voltage buffer and an individual partition among said plurality of partitions; and
   a controller to selectively open and close said plurality of switches to enable said reference voltage buffer to charge said capacitance of each partition of a first group of partitions among said plurality of partitions while at least one individual partition is electrically isolated from said reference voltage buffer and said first group of partitions.

9. The memory device of claim 8, wherein said first group of partitions includes one or more memory cells in a standby state.

10. The memory device of claim 8, wherein said at least one individual electrically isolated partition includes one or more memory cells in a read and/or verify state.

11. The memory device of claim 10, wherein said capacitance of said at least one individual electrically isolated partition is adapted to supply a reference voltage to said one or more sense amplifiers of said at least one individual electrically isolated partition.

12. The memory device of claim 11, wherein said capacitance comprises a capacitor.

13. The memory device of claim 11, wherein said first capacitance comprises a stray capacitance of each of said plurality of partitions.

14. The memory device of claim 8, wherein said memory cells comprise phase change memory cells.

15. The memory device of claim 8, wherein said memory cells comprise multilevel flash memory cells.

16. An apparatus comprising:
   means for charging a first capacitance via a closed first switch of a first partition that includes a first group of sense amplifiers associated with a first plurality of memory cells;
   means for electrically isolating said first partition from a second partition that includes a second group of sense amplifiers associated with a second plurality of memory cells by opening said first switch; and
   means for supplying a reference voltage from said first capacitance to said first group of sense amplifiers to read and/or verify said first plurality of memory cells while said first partition is electrically isolated from said second partition.

17. The apparatus of claim 16, further comprising:
   means for charging a second capacitance via a closed second switch of said second partition while said first partition is electrically isolated from said second partition.

18. The apparatus of claim 16, further comprising:
   means for operating said second plurality of memory cells in a standby state while said first partition is electrically isolated from said second partition.

19. The apparatus of claim 16, wherein said first and second capacitance comprises a capacitor.

20. The apparatus of claim 16, wherein said first and second capacitances comprise a stray capacitance of said first and second partitions, respectively.

* * * * *